US011196282B2

United States Patent
Holscher et al.

(10) Patent No.: US 11,196,282 B2
(45) Date of Patent: Dec. 7, 2021

(54) EMERGENCY LIGHTING ASSEMBLY HAVING HEAT CONDUCTING MEMBER

(71) Applicant: Hubbell Incorporated, Shelton, CT (US)

(72) Inventors: Steven Holscher, Boiling Springs, SC (US); Han Lei, Greenville, SC (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 16/774,751

(22) Filed: Jan. 28, 2020

(65) Prior Publication Data

US 2020/0166188 A1    May 28, 2020

Related U.S. Application Data

(60) Division of application No. 15/695,436, filed on Sep. 5, 2017, now Pat. No. 10,563,831, which is a
(Continued)

(51) Int. Cl.
  *F21V 29/507*  (2015.01)
  *F21V 29/74*   (2015.01)
  (Continued)

(52) U.S. Cl.
  CPC ............... *H02J 7/02* (2013.01); *F21S 9/022* (2013.01); *F21V 21/30* (2013.01); *F21V 29/507* (2015.01);
  (Continued)

(58) Field of Classification Search
  CPC ............... F21S 9/02–038; F21V 21/30; F21V 17/16–168; F21V 14/02–14/025;
  (Continued)

(56) References Cited

U.S. PATENT DOCUMENTS

| 4,499,528 A | 2/1985 | Hawlitzki |
| 5,050,047 A | 9/1991 | Viner et al. |

(Continued)

FOREIGN PATENT DOCUMENTS

| DE | 102012101228 A1 * | 8/2012 | ............... F21V 5/04 |
| DE | 102017109135 B3 * | 5/2018 | .............. F21V 21/30 |

(Continued)

OTHER PUBLICATIONS

U.S. Appl. No. 10/626,348, Pickard et al., filed Jul. 23, 2003, Specification and Drawings (Year: 2003).

*Primary Examiner* — Mariceli Santiago
(74) *Attorney, Agent, or Firm* — Michael Best & Friedrich LLP

(57) ABSTRACT

An emergency lighting assembly is provided having a housing with one or more adjustable lamp assemblies for aiming the light at selected areas. The lamp assembly is mounted in the housing by a ball and socket arrangement. The lamp assembly has a substantially spherical shape with a front section made of a heat conducting material and a rear section made of a plastic material. The front section has an opening on a front side having a lens and a base spaced from the front side supporting the light source. The light source in one embodiment is an LED which is coupled to the front section to conduct heat from the LED away from the LED and the housing. The rear section has an opening in the rear side that receives a fixed stop member to limit pivoting movement of the lamp assembly with respect to the housing. The rear section also includes a projection oriented to contact the stop member to limit rotation of the lamp assembly with respect to the housing.

20 Claims, 6 Drawing Sheets

Related U.S. Application Data continuation of application No. 13/220,002, filed on Aug. 29, 2011, now Pat. No. 9,752,739.

(51) Int. Cl.

| | | |
|---|---|---|
| *F21V 21/30* | (2006.01) | |
| *F21S 9/02* | (2006.01) | |
| *F21Y 115/10* | (2016.01) | |
| *H02J 7/02* | (2016.01) | |
| *H02J 7/00* | (2006.01) | |
| *H05B 45/56* | (2020.01) | |
| *H02J 7/04* | (2006.01) | |
| *H02J 9/06* | (2006.01) | |
| *H03K 5/24* | (2006.01) | |

(52) U.S. Cl.
CPC ............ *F21V 29/74* (2015.01); *H02J 7/0013* (2013.01); *H02J 7/0071* (2020.01); *H02J 7/00712* (2020.01); *H02J 7/00714* (2020.01); *H02J 7/022* (2013.01); *H02J 7/045* (2013.01); *H02J 9/061* (2013.01); *H03K 5/24* (2013.01); *H05B 45/56* (2020.01); *F21Y 2115/10* (2016.08); *H02J 7/007* (2013.01)

(58) Field of Classification Search
CPC ......... F21V 15/01; F21V 19/001–0055; F21V 23/003–005; F21W 2111/00–10
See application file for complete search history.

(56) References Cited

U.S. PATENT DOCUMENTS

| | | | |
|---|---|---|---|
| 5,605,394 A | 2/1997 | Chen | |
| 6,019,477 A | 2/2000 | Wegrzyn | |
| 6,045,242 A | 4/2000 | Wegrzyn et al. | |
| 6,193,395 B1 | 2/2001 | Logan | |
| 6,280,042 B1 | 8/2001 | Wegrzyn et al. | |
| 6,481,874 B2 | 11/2002 | Petroski | |
| 6,741,324 B1 | 5/2004 | Kim | |
| 6,969,182 B2 | 11/2005 | Kotovsky | |
| 7,073,930 B2 | 7/2006 | Tiesler et al. | |
| 7,182,487 B1 | 2/2007 | Pickard | |
| 7,198,398 B2 | 4/2007 | Buelow et al. | |
| 7,220,014 B2 | 5/2007 | Lay et al. | |
| 7,290,905 B2 | 11/2007 | Tiesler | |
| 7,513,657 B2 | 4/2009 | Den Boer | |
| 7,654,705 B2 | 2/2010 | Czech et al. | |
| 7,722,227 B2 | 5/2010 | Zhang et al. | |
| 7,744,259 B2 | 6/2010 | Walczak et al. | |
| 7,866,850 B2 | 1/2011 | Alexander et al. | |
| 8,356,920 B2 * | 1/2013 | Levine | F21V 21/30 362/421 |
| 2005/0094395 A1 | 5/2005 | Rosenberg | |
| 2006/0072304 A1 | 4/2006 | Lay | |
| 2008/0013326 A1 * | 1/2008 | Den Boer | F21V 15/01 362/364 |
| 2009/0154151 A1 * | 6/2009 | Levine | F21V 23/0435 362/184 |
| 2011/0013399 A1 | 1/2011 | Hu | |
| 2012/0033434 A1 * | 2/2012 | Wang | F21S 8/033 362/366 |

FOREIGN PATENT DOCUMENTS

| | | | | |
|---|---|---|---|---|
| EP | 1674792 A2 * | 6/2006 | ............. | F16M 11/14 |
| JP | 2008140625 A * | 6/2008 | ................ | F21S 8/02 |

* cited by examiner

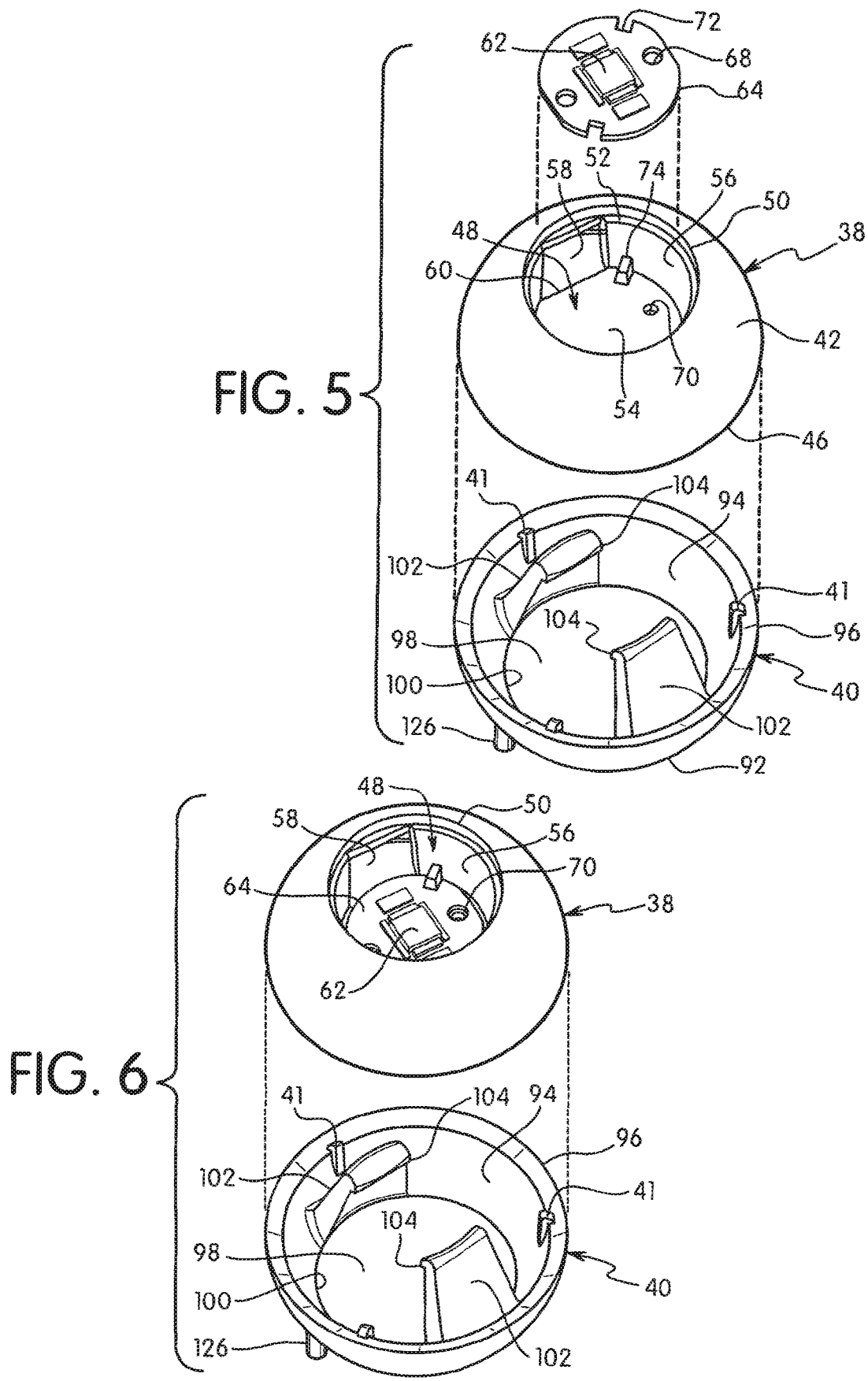

EMERGENCY LIGHTING ASSEMBLY HAVING HEAT CONDUCTING MEMBER

RELATED APPLICATION(S)

This application is a divisional of U.S. application Ser. No. 15/695,436, filed Sep. 5, 2017, which is a continuation of U.S. application Ser. No. 13/220,002, filed on Aug. 29, 2011, the disclosures of which are incorporated herein by reference in their entirety and to which priority is claimed.

FIELD

The present invention is directed to an emergency lighting system having an LED light source. The invention is particularly directed to an emergency lighting assembly where the LED light source is a ball and socket for adjusting the position of the light source and having heat conducting member to prevent overheating.

BACKGROUND

Emergency light fixtures are commonly used in public buildings to illuminate areas such as stairs and exits in the event of a power failure. These fixtures have an emergency backup power system such as a battery that automatically turns the emergency light on when the primary power source is interrupted.

The prior emergency lights include one or more incandescent lights that can be adjusted to direct the light to a specific location. The incandescent lights require large batteries to operate the light for sufficient time to allow the public to exit the building in the event of an emergency. This requires the housing to be of sufficient size to house the batter and requires the housing toe be of sufficient strength to support the weight of the battery while being mounted on a wall. Incandescent lights generally require large reflectors to direct the light to a target area which increase the size of the unit.

Emergency lights are often constructed from a housing with two lights adjustably mounted on the housing. Examples of such devices are disclosed in U.S. Pat. No. 5,797,673 to Logan et al., U.S. Pat. No. 6,848,798 to Logan et al., U.S. Pat. No. 6,309,085 to Katz et al., and U.S. Pat. No. 6,606,808 to Katz.

U.S. Patent Publication No. 2011/0013399 to Hu discloses an LED light assembly having a housing with external fins for dissipating heat. The light assembly is constructed for use in existing lamp sockets.

U.S. Pat. No. 7,866,850 to Alexander et al. discloses an adjustable LED lighting assembly for mounting to a wall or support. The assembly includes a compression element that compresses from a first position to a second position to generate a compression force to reduce the thermal impediments between the LED assembly and the thermal conductive housing. The thermal conductive housing includes a plurality of external fins.

U.S. Pat. No. 7,744,259 to Walczak et al. discloses an adjustable LED spotlight having a fixed heat sink and an LED array bearing structure. The LED structure has a ball and socket arrangement where the ball is received within the housing. The housing has a plurality of external fins for dissipating the heat from the LED.

U.S. Pat. No. 7,722,227 to Zhang et al. discloses a recessed lighting structure having an LED contained within the housing. The housing includes a plurality of fins for dissipating the heat.

U.S. Pat. No. 7,513,657 to Den Boer discloses an illumination device having an LED light source mounted within a ball that fits within a socket. The housing includes an annular ring to couple the ball within the socket.

U.S. Pat. No. 7,290,905 to Tiesler discloses a trim panel assembly having a pivotal light mechanism. The light assembly can pivot to various positions within the housing.

U.S. Pat. No. 7,198,398 to Buelow et al. discloses an adjustable light pipe fixture having a ball and socket arrangement. The ball includes a reflective inner surface and a lens and a connecting portion for connecting to the light pipe.

U.S. Pat. No. 6,741,324 to Kim discloses a low profile combination exit and emergency light system having an LED lighting strip for illuminating the exit sign. The assembly includes integral end portions with separate downwardly shining lights. The lights are a ball and socket arrangement.

U.S. Pat. No. 6,481,874 to Petroski discloses a high power LED lamp having a heat sink secured to the die. The housing is positioned between the heat sink and the external environment. Heat within the die is conducted to the heat sink and the housing conducts the heat received from the heat sink to the external environment.

The prior lighting fixtures have generally been suitable for their intended purpose. There is, however, a continuing need in the industry for improved lighting fixtures to meet the current trends in the industry.

SUMMARY

The present invention is directed to a lighting fixture having an LED light source and a heat dissipating system. The invention is particularly directed to an emergency lighting assembly having an LED light source that can be adjustable to direct the light to a selected area and where heat generated by the LED is directed away from the LED.

Accordingly, a primary feature of the invention is to provide an emergency lighting assembly having a housing and one or more adjustable LED lights. The housing encloses suitable wiring and circuits and a battery as a backup power source when the primary power supply is interrupted.

Another aspect of the invention is to provide an adjustable LED light mounted in a housing for adjustment to a number of different orientations. The adjustable LED light has an outer portion forming a shell where at least a portion of the outer portion is made from a heat conducting material such as metal. A portion of the LED light extends outwardly from the housing to dissipate the heat generated by the LED.

A further aspect of the invention is to provide an emergency light assembly where the light is an LED mounted in the housing by a ball and socket arrangement. The lamp assembly encloses the LED light and is mounted for swiveling movement to orient the light in a selected direction. The lamp assembly has a substantially spherical shape resembling a ball to move within the socket of the housing. The lamp assembly is formed from a rear section that is made of a plastic material mounted in the housing and a front section made of a heat conducting material which extends from the housing to conduct heat away from the LED.

A further aspect of the invention is to provide an adjustable light assembly where a lamp is mounted in a housing in a ball and socket arrangement having a stop mechanism to limit rotational movement of the lamp. The lamp can be a substantially spherical shape having a front side for directing light to a target area and rear side mounted to the housing.

The rear side has an opening that receives a stop member extending from the housing. The stop member is in a fixed location to limit the rotational movement of the lamp.

These and other aspects of the invention are basically attained by providing an emergency lighting assembly comprising a housing having an outer wall defining an inner cavity and having at least one opening in the outer wall defining a socket. An electrical power source is contained within the housing. At least one substantially spherical lamp assembly is connected to the power source and is mounted in the opening in the housing for swiveling movement with respect to the housing. The lamp assembly has a rear section with a convex outer surface received in the opening in the housing, and a front section coupled to the rear section and facing outwardly from the opening in the housing. The front section has an LED light source coupled thereto made of a heat conducting material to dissipate heat from the LED light source away from the housing.

The various aspects of the invention are also attained by providing a lighting assembly comprising a housing having an opening therein and a lamp assembly adjustably mounted in the opening in the housing. The lamp assembly has a rear section mounted in the opening in the housing for movement in at least one direction. A front section is coupled to the rear section to extend outwardly from the opening in the housing. The front section is made of a heat conducting material and has a base and LED light source on the base, and an opening spaced from the base for directing light to a target area. The LED is coupled to the front section to conduct heat from the LED away from the housing.

Other aspects of the invention are attained by providing an emergency lighting assembly comprising a housing enclosing an emergency power source and having at least two openings in an outer wall, the opening defining a socket. A substantially spherical shaped lamp assembly is mounted in each of the openings in the housing and is independently adjustable for pivoting and swiveling movement within the opening. Each lamp assembly has a front side and a rear side and encloses a light source. The rear side of the lamp assembly has an opening and the housing has a stop member positioned in the opening in the lamp assembly to limit pivoting movement of the lamp assembly within the respective opening in the housing.

These and other aspects, advantages and features of the invention will become apparent from the following detailed description of the invention which discloses various embodiments of the invention.

BRIEF DESCRIPTION OF THE DRAWINGS

The following is a brief description of the drawings, in which:

FIG. 5 is an exploded view of the lamp assembly of the emergency light of FIG. 1;

FIG. 6 is an exploded view of the lamp assembly showing the LED lamp mounted in the front portion of the lamp assembly;

DETAILED DESCRIPTION

Figure 1:
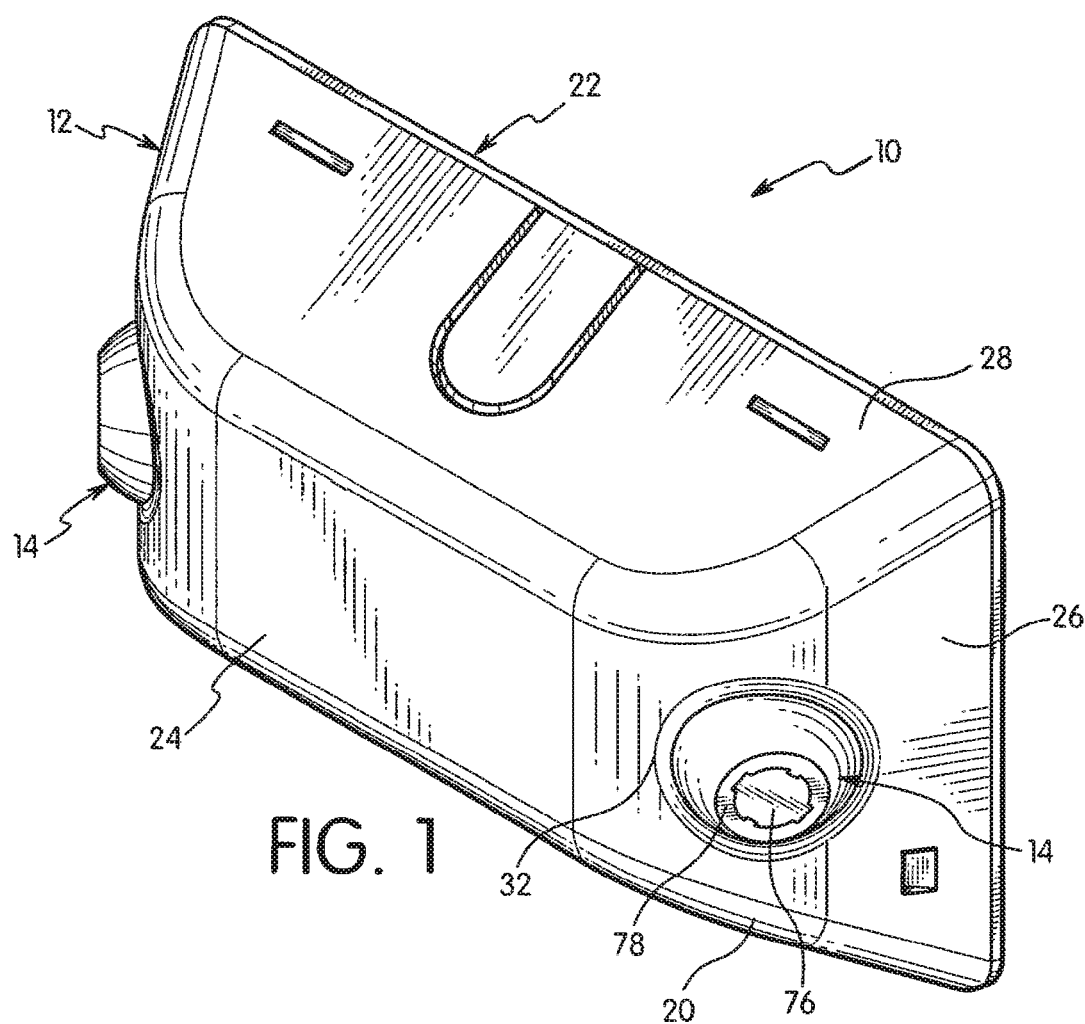
FIG. 1 is a perspective view of the emergency light of the invention.

The present invention is directed to a lighting system and particularly an emergency lighting assembly having adjustable lighting units for directing light to a selected area. The emergency lighting assembly 10 of the invention includes a housing 12 and an adjustable lamp assembly 14.

The lighting assembly 10 in preferred embodiments of the invention provides lighting to an area when there is interruption of electrical power. The emergency lighting assembly includes a battery 16 shown in FIG. 4 and suitable circuitry 18 for actuating the lamp assembly 14. Emergency lighting assembly 10 is connected to a suitable power source (not shown) for maintaining the battery in a charged condition. The circuitry actuates the lamp assembly when the primary source of power is interrupted. The circuitry can be conventional circuitry as known in the art for actuating the lamp assembly.

Figure 2:
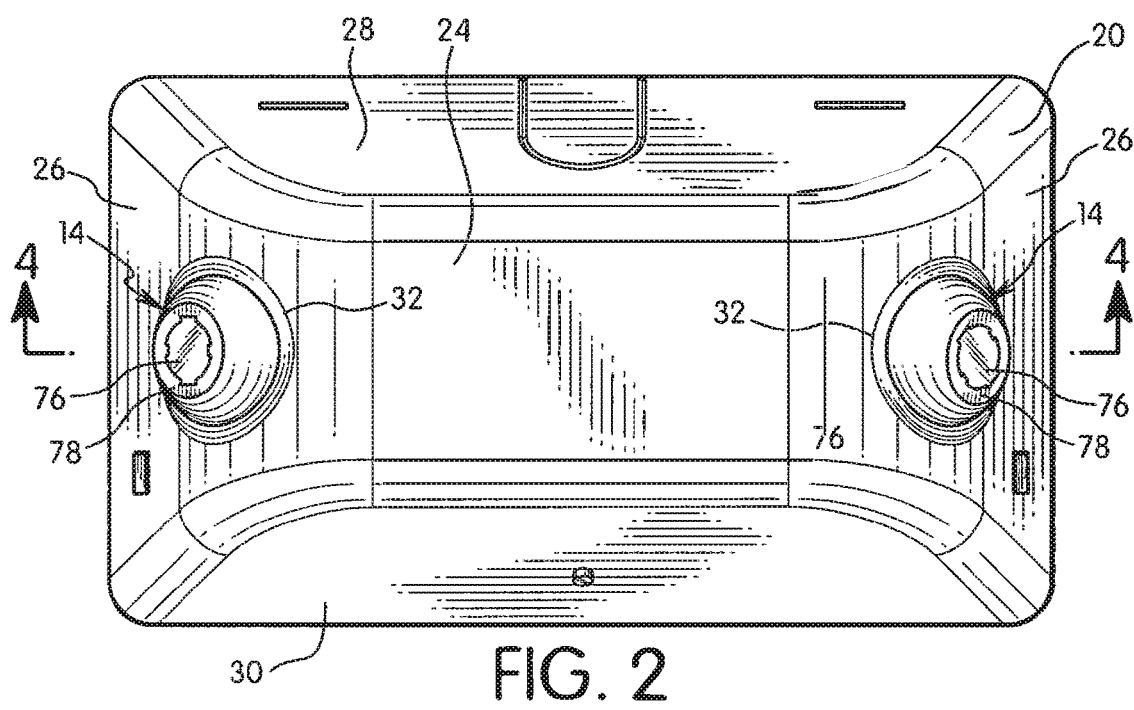
FIG. 2 is a front elevational view of the emergency light of FIG. 1.
Figure 3:
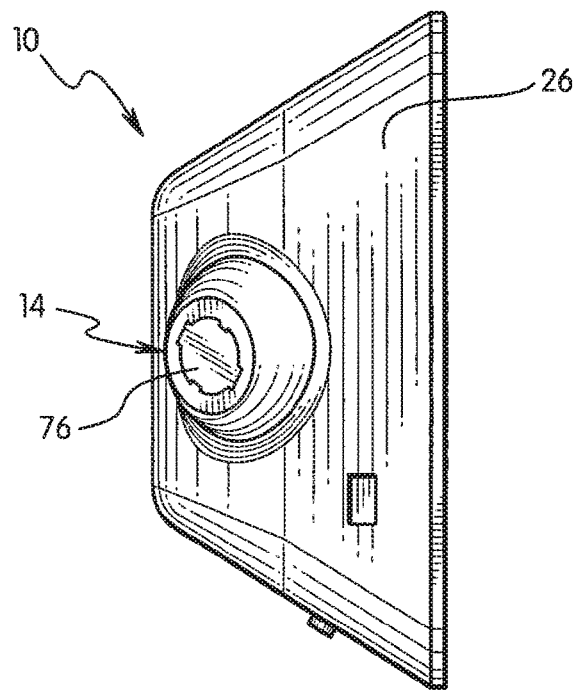
FIG. 3 is a side view of the emergency light of FIG. 1.

The housing 12 in the embodiment shown has a main body 20 and a back wall 22. The back wall 22 is typically mounted against a wall or other support surface. The main body 20 and the back wall 22 are typically made of a molded rigid plastic material where the back wall 22 is connected to the main body 20 by a snap connection. The main body 20 as shown in FIGS. 1-3 has a front wall 24, inclined side walls 26, and inclined top wall 28 and inclined bottom wall 30. Side walls 26 are oriented at an incline with respect to the front wall to direct light in a generally outward and forward direction with respect to the housing.

Figure 4:
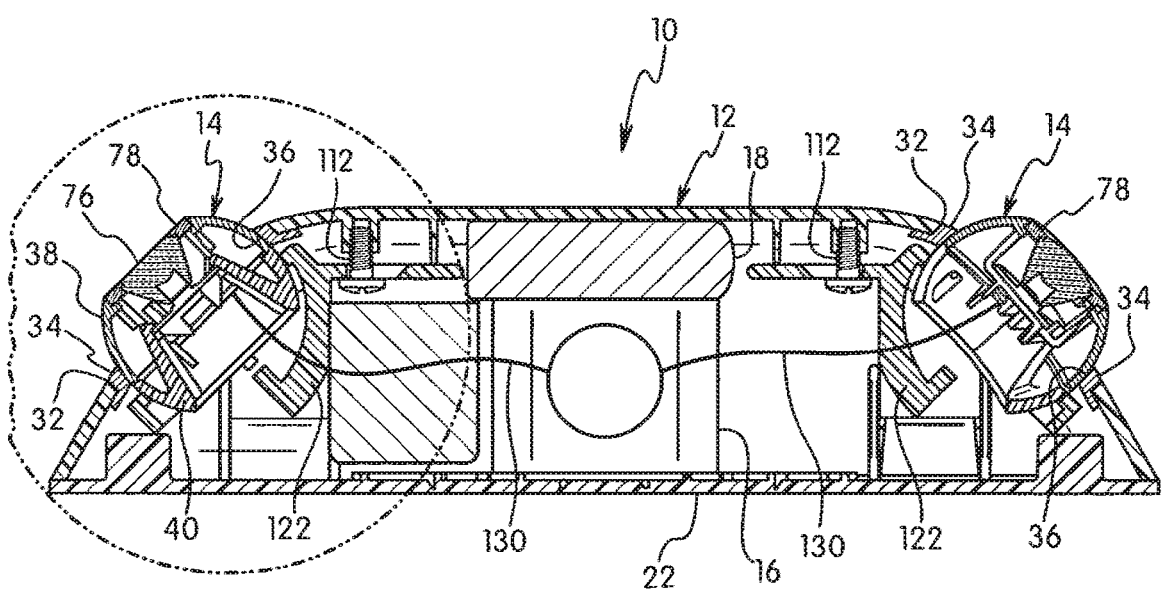
FIG. 4 is a cross-sectional view of the emergency light taken along line 4-4 of FIG. 2.
Figure 7:
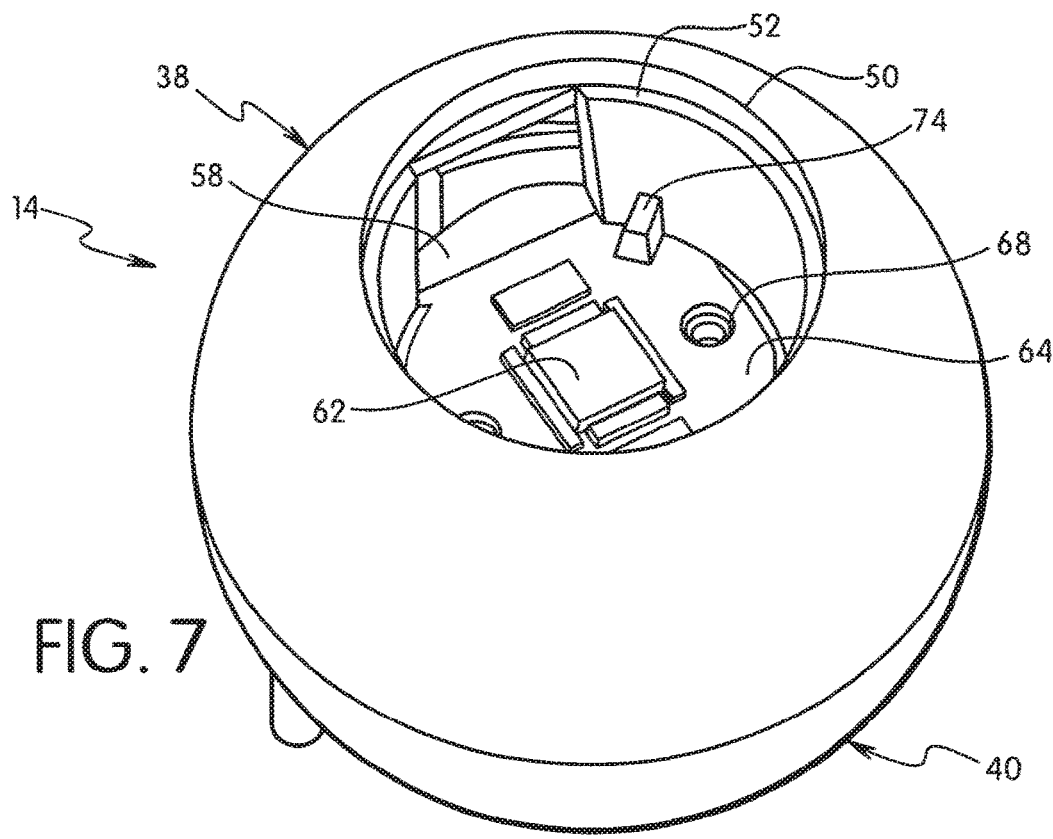
FIG. 7 is a perspective view of the lamp assembly with the lens removed.

Referring to FIG. 4, housing 12 has an opening 32 for supporting the lamp assembly 14. A bushing 34 is received in the opening 32 for supporting the lamp assembly 14. The bushing 34 in the embodiment illustrated has a circular shape that snaps into a circular opening in the housing. The bushing 34 in the embodiment illustrated has a circular opening forming an inwardly facing bearing surface 36. The bushing 34 has a thickness greater than the thickness of the side walls sufficient for supporting the lamp assembly while allowing the sliding movement between the lamp assembly and the housing.

Lamp assembly 14 has a substantially spherical shape with a dimension to fit within the opening of the bushing 34. The bushing 34 and the lamp assembly 14 form a ball and socket assembly for allowing the lamp assembly to be adjusted in a variety of orientations. The lamp assembly is able to pivot in a side to side and up and down direction with respect to the housing to allow aiming of the lamp assembly in the desired location. Each lamp assembly 14 shown in FIG. 4 is independently adjustable.

The lamp assembly 14 as shown in FIGS. 5 and 6 is formed from a front portion forming front section 38 and a rear portion forming a rear section 40. The front section 38 and rear section 40 are coupled together to form the spherical shaped lamp assembly shown in FIG. 4. Each of the front section 38 and rear section 40 form a substantially hemispherical shape. The front section 38 extends outwardly from the housing as shown in FIG. 4 and extends outwardly from the side walls. The rear section 40 is maintained primarily within the cavity of the housing. The front and rear sections can be coupled together by snap connectors 41 on the rear section 40 or by other suitable connecting means.

Figure 8:
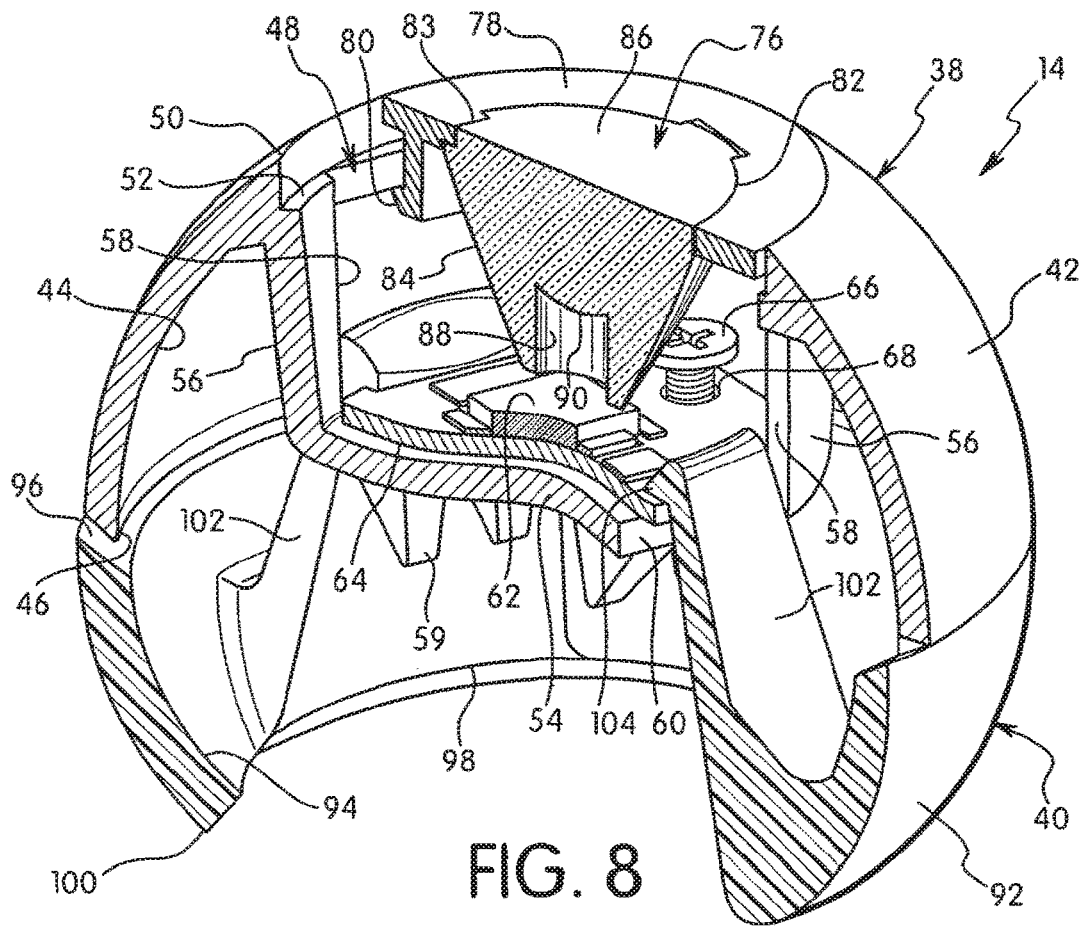
FIG. 8 is a cross-sectional view of the lamp assembly of the invention.

The front section 38 of lamp assembly 14 has a convex outer surface 42 and a concave inner surface 44. The front section 38 has a circular bottom edge 46 for joining with the rear section 40. The front section 38 has an opening 48 defining a front edge 50. As shown in FIG. 8, opening 48 includes an inwardly extending lip 52 spaced from the front edge 50.

Front section 38 is provided with a base 54 spaced from the front edge 50 by a cylindrical wall 56 extending downwardly from the front edge 50. An opening 58 is formed on opposite sides of the cylindrical wall 56. The opening 58 extends to the base 54 to form a straight edge 60 on opposite sides of the base. The openings 58 have a dimension to allow suitable wiring to pass through for connecting to the light source. The base 54 has a bottom face with a plurality of downwardly extending fins 59 to increase the surface area for conducting excess heat away from the LED. In the embodiment shown, the fins 59 have a substantially triangular shape, although the fins can have other shapes that are capable of cooling the base 54 and preventing heat related damage to the LED.

The light source in a preferred embodiment of the invention is an LED 62 mounted on a printed circuit board 64. The printed circuit board 64 is mounted on the base 54 and attached by a screw 66 or other fastener that extends through a hole 68 in the printed circuit board 64 and is threaded into a hole 70 in the base 54. The printed circuit board 64 includes a notch 72 for aligning with an alignment tab 74 on the base 54.

Printed circuit board 64 has a substantially circular configuration as shown in FIG. 5 with a dimension to fit within the opening in the front section and seat on the base 54. As shown in FIG. 6 and FIG. 8, an outer edge of the printed circuit board 64 extends from and overhangs the straight edge 60 of the base 54.

LED 62 can be a conventional array of LEDs or a single LED as known in the art. The LED array is selected to be sufficient to illuminate the desired area. As shown in FIG. 8, a lens 76 is mounted in a lens retainer ring 78 and coupled to the front section 38. The retainer ring 78 has a circular configuration with a thickness corresponding to the depth of the lip 52. A downwardly extending hook-like member 80 is provided for hooking to the bottom edge of the lip 52 for fastening the lens retainer ring 78 to the front section 38. The lens 76 is received within a circular opening 82 in the retainer ring 78 and is held in place by inwardly extending tabs 83 on the retainer ring 78. The lens 76 in the embodiment shown has a frustoconical shape with an inclined side wall 84 and a flat outer surface 86. The body of the lens has a cylindrical shaped opening 88 at an inner end adjacent the LED 62 and a convex bottom surface 90 in the opening 88.

Front section 38 is preferably made of a heat conducting material such as aluminum or other metal and rear section 40 is preferably made of a non-conducting material such as a plastic. The printed circuit board 64 is attached to the base 54 in a manner to transfer heat from the LED and printed circuit board through the base and the cylindrical side wall 56 to the outer shell of the front section 38. Heat within the cavity of the lamp assembly is also conducted through the wall of the front section. The outer surface 42 of the front section 38 faces outwardly from the housing to dissipate the heat from the LED and prevent damage to the LED and the printed circuit board. The assembly is received in the socket so that a sufficient surface area of the front section is exposed to dissipate the heat from the LED outward from the front of the housing. The housing is preferably made of plastic so that minimal heat is conducted through the walls of the housing. The rear section 40 is also made of plastic to reduce the heat conduction into the housing from the LED.

Figure 9:
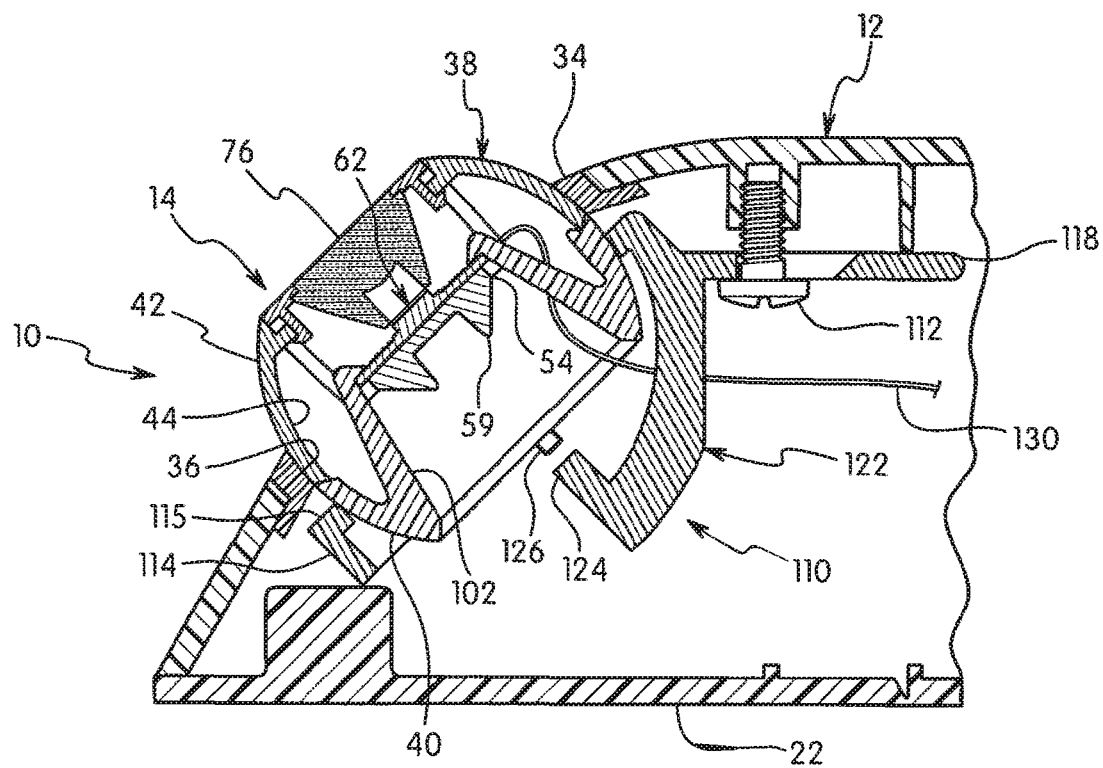
FIG. 9 is a partial cross-sectional view of the lamp assembly and housing.

The rear section 40 of the lamp assembly 14 has a complementing spherical shape with a convex outer surface 92 and a concave inner surface 94. Rear section 40 has a top edge 96 and an opening 98 forming a bottom edge 100. The top edge 96 mates with the bottom edge 46 of the front section 38 to form the spherical shaped lamp assembly 14. A pair of legs 102 extend from the inner surface 94 towards the upper end of the rear section 40 as shown in FIGS. 4 and 5. The upper end of the legs 102 include an inwardly extending hook portion 104. The tabs 41 extend upwardly from the top edge 96 for aligning and coupling the front section and rear section together. The rear section 40 is snapped together with the front section 38 so that the legs 102 extend through the opening 58 in the side wall 56 of the first section 38 as shown in FIG. 8. The hook portion 104 hooks over the top edge of the printed circuit board 64 in the area that extends over the straight edge 60 as shown in FIGS. 8 and 9. The legs snap onto the printed circuit board 64 to hold the printed circuit board in contact with the heat conducting material of the base.

The lighting assembly is assembled by positioning the lamp assembly 14 from the inner side of the housing into the socket opening defined by the bushing 34 as shown in FIG. 9. The lamp assembly 14 is held in place by a retainer 110 in the form of a ring-like member coupled to the inner surface of the housing by a screw 112. The opening in the bushing 34 has a dimension slightly less than the outermost dimension of the spherical shaped lamp assembly 14 to retain the lamp assembly 14 in the housing. The retainer 110 includes a ring 114 with an inwardly extending lip 115 having an inner edge 116 with an inner dimension slightly less than the outermost dimension of the spherical lamp assembly 14. The retainer 110 is attached to the housing to capture the lamp assembly 14 between the ring 114 and the bushing 34 as shown in FIG. 9. A mounting flange 118 having a screw hole 120 is provided for attaching the retainer 110 to the housing by the screw 112.

Figure 10:
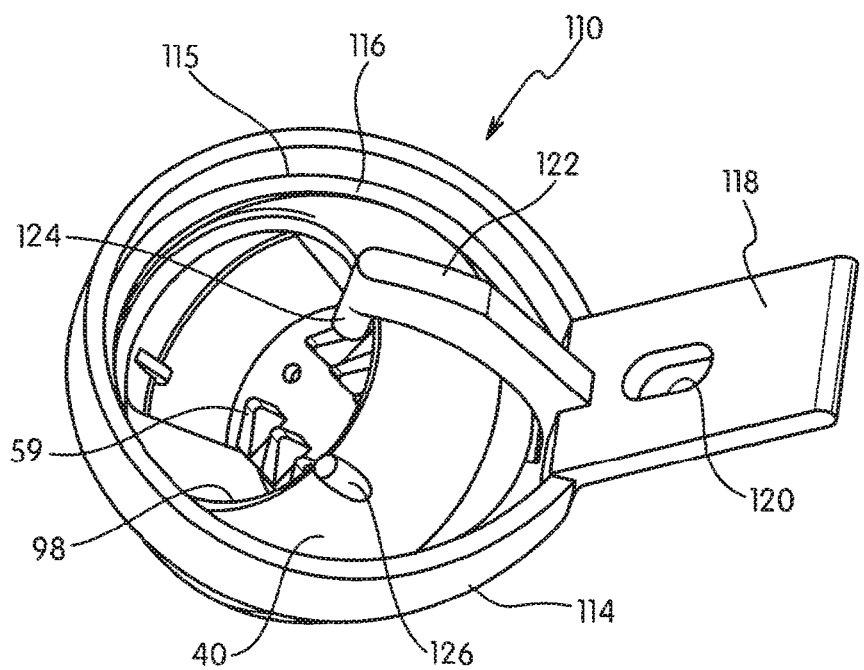
FIG. 10 is a bottom view of the lamp assembly retainer member for limiting movement of the lamp assembly and showing the lamp assembly in a first position.
Figure 11:
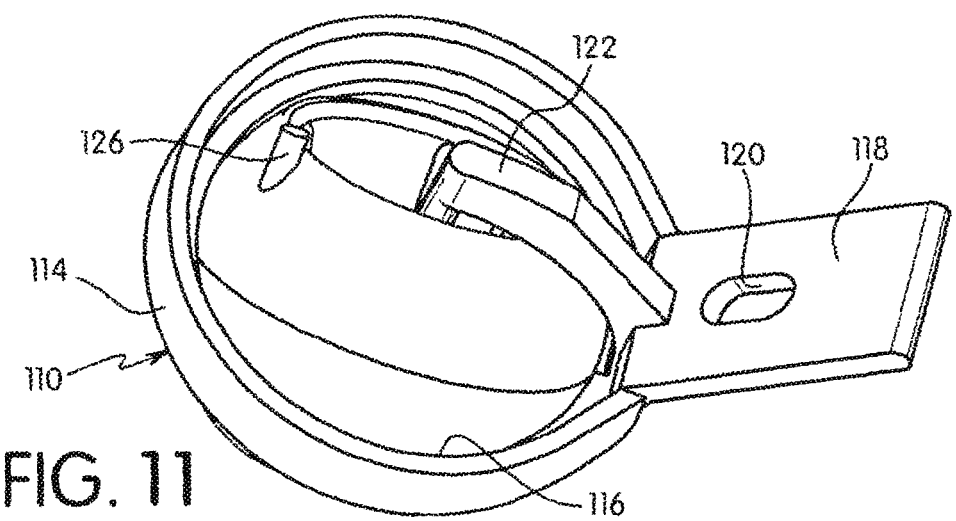
FIG. 11 is a bottom view of the lamp assembly showing the lamp assembly in a second position.
Figure 12:
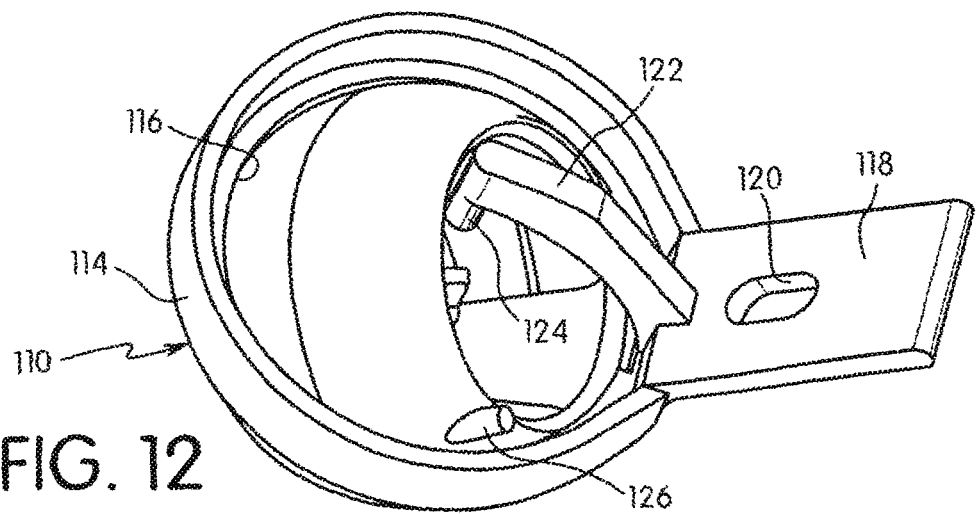
FIG. 12 is a bottom view showing the lamp assembly in a third position.
Figure 13:
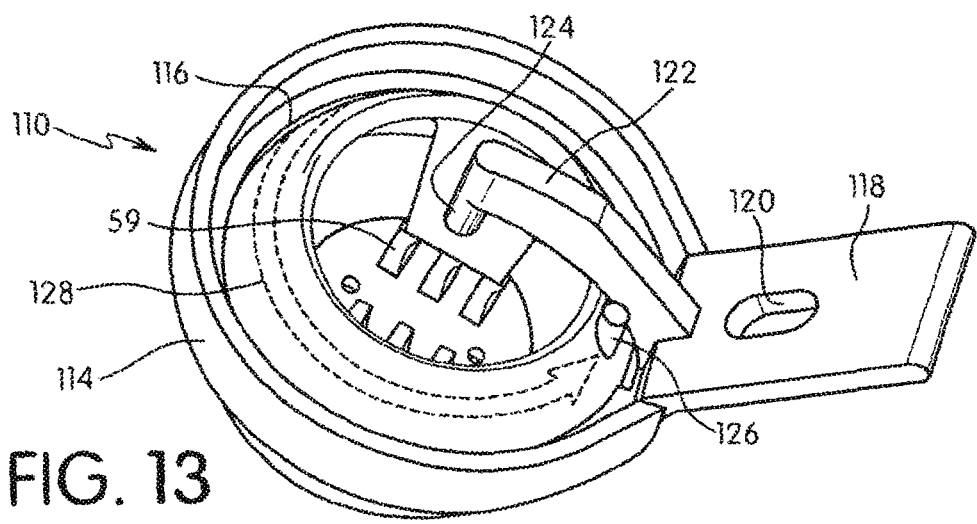
FIG. 13 is a bottom view showing the stop member to limit rotation of the lamp assembly.

Referring to FIGS. 10-13, the retainer 110 includes an arm 122 defining a stop member for limiting the rotational movement of the lamp assembly with respect to the housing. The arm 122 has a substantially arcuate shape conforming to the shape of the outer surface of the lamp assembly 14. As shown in FIG. 9, the arm extends to a midpoint of the ring 114 and includes an inwardly extending detent forming a post 124. The post 124 has a length to extend towards the open end of the rear section to engage the bottom edge 100 of the rear section when the lamp assembly is rotated or pivoted within the socket as shown in FIG. 10. The post is positioned to contact the bottom edge 100 of the opening 98 so that the lamp assembly 14 can be pivoted in an up and down direction and a side to side direction with respect to the housing while limiting the travel so that the lamp assembly can be focused and directed within a specified field. The post also prevents the lamp assembly from being rotated to a point where the light is directed towards the housing itself. The outer surface of the rear section 40 also includes a stop member 126 in the form of a post that extends in a direction outwardly from the surface of the rear section 40. The stop member 126 extends a distance to contact the arm 122 when the lamp assembly 14 is rotated to the position shown in FIG. 3. In the manner, the stop 126 enables the lamp assembly to be rotated about an axis extending through the opening in the housing slightly less than 360°. The stop member limits the rotation of the lamp assembly in the direction of arrow 128 shown in FIG. 13 to prevent wires extending between the power source and the printed circuit board from being twisted or tangled.

In use, the printed circuit board and the LED are connected to the battery or other power source by wires 130 or other electrical connection that extend through the opening in the cylindrical wall of the front section 38. The lighting assembly is assembled as shown in FIGS. 1 and 4 and mounted to a wall or other support surface. The lighting assembly is then connected to a power source to maintain the battery in a charged condition. Typically, the lighting assembly is wired to an electrical junction box or electrical receptacle as known in the art. Each of the lamp assemblies 14 can be independently adjusted to direct the beam of light produced from the LED to a selected area. The lamp assemblies can pivot and swivel within the socket defined by the opening in the housing and the retainer ring.

While various embodiments have been disclosed, it will be understood that various changes and modifications can be made without departing from the spirit and scope of the invention as defined in the appended claims.

What is claimed is:

1. A lighting assembly comprising:
    a housing having an outer wall defining an inner cavity, and having at least one opening in the outer wall defining a socket;
    at least one substantially spherical lamp assembly mounted in the opening in the housing for movement with respect to said housing, the lamp assembly having a rear section received in the opening in the housing, and a front section coupled to the rear section with a snap-fit connection and facing outwardly from the opening in the housing, wherein the front section includes a base and an alignment tab extending from the base; and
    a light source connected to the lamp assembly, the light source including a notch receiving the alignment tab to align the light source on the base.

2. The lighting assembly of claim 1, wherein the snap-fit connection includes at least one leg with a hook portion.

3. The lighting assembly of claim 2, wherein the front section includes a base and the hook portion extends from the rear section to connect to the base.

4. The lighting assembly of claim 3, wherein the front section includes an opening and the leg extends through the opening.

5. The lighting assembly of claim 3, wherein the light source is connected to the base.

6. The lighting assembly of claim 5, wherein the hook portion directly engages the light source.

7. The lighting assembly of claim 5, wherein the light source includes an LED connected to a printed circuit board.

8. The lighting assembly of claim 1, further comprising a lens connected to the front section.

9. The lighting assembly of claim 1, wherein the front section is made from a first material having a first thermal conductivity and the rear section is made from a second material having a second thermal conductivity less than said first thermal conductivity.

10. A lighting assembly comprising:
    a housing having an outer wall defining an inner cavity, and having at least one opening in the outer wall defining a socket;
    at least one substantially spherical lamp assembly mounted in the opening in the housing for movement with respect to said housing, the lamp assembly having a rear section with a convex outer surface movably received in the opening in the housing, and a front section coupled to the rear section facing outwardly from the opening in the housing, wherein the front section includes a base and an alignment tab extending from the base; and
    a light source connected to the lamp assembly, the light source including a notch receiving the alignment tab to align the light source on the base, wherein the light source is rotatable with the rear section relative to the housing.

11. The lighting assembly of claim 10, wherein the light source includes a LED connected to a printed circuit board and wherein the notch is formed on the printed circuit board.

12. The lighting assembly of claim 10, further comprising a lens connected to the front section.

13. The lighting assembly of claim 12, further comprising a lens ring connecting the lens to the front section.

14. The lighting assembly of claim 13, wherein the lens ring includes a hook member engaging the front section.

15. The lighting assembly of claim 10, wherein the front section includes a first sidewall and an opening formed in the sidewall.

16. The light assembly of claim 15, wherein the rear section includes a leg with a hook portion, and wherein the leg extends through the opening and the hook portion connects to the base to snap-fit the front section to the rear section.

17. The lighting assembly of claim 16, wherein the light source includes an LED connected to a printed circuit board and the hook portion directly engages the printed circuit board.

18. The lighting assembly of claim 10, wherein the light source is connected to the base with a fastener.

19. The lighting assembly of claim 10, wherein the rear section includes a stop extending outwardly from the convex surface to limit rotation of the rear section.

20. The light assembly of claim 19, wherein the stop is configured to engage an arm positioned in the housing.

* * * * *